(12) United States Patent
Wu

(10) Patent No.: US 8,247,835 B2
(45) Date of Patent: Aug. 21, 2012

(54) LED PACKAGE WITH TOP AND BOTTOM ELECTRODES

(75) Inventor: Jiahn-Chang Wu, Hsinchu (TW)

(73) Assignee: Cheng Kung Capital, LLC, Wilmington, DE (US)

( * ) Notice: Subject to any disclaimer, the term of this patent is extended or adjusted under 35 U.S.C. 154(b) by 441 days.

(21) Appl. No.: 12/554,189

(22) Filed: Sep. 4, 2009

(65) Prior Publication Data

US 2011/0012162 A1 Jan. 20, 2011

(30) Foreign Application Priority Data

Jul. 16, 2009 (TW) .............................. 98124031 A

(51) Int. Cl.
*H01L 29/22* (2006.01)
*H01L 23/495* (2006.01)
(52) U.S. Cl. .......... 257/99; 257/666; 257/672; 257/676; 257/E23.045

(58) Field of Classification Search ..................... 257/99, 257/666, 672, 676, E23.045
See application file for complete search history.

(56) References Cited

U.S. PATENT DOCUMENTS

| 2002/0140079 A1* | 10/2002 | Takeyama | 257/698 |
| 2005/0280158 A1* | 12/2005 | Crane et al. | 257/773 |
| 2008/0073762 A1* | 3/2008 | Han | 257/675 |

* cited by examiner

*Primary Examiner* — Thanh V Pham
(74) *Attorney, Agent, or Firm* — Christensen O'Connor Johnson Kindness PLLC

(57) ABSTRACT

An LED package with an extended top electrode and an extended bottom electrode is made from a single metal sheet, one manufacturing process embodiment includes: preparing a piece of single metal sheet, forming a first metal and a coplanar second metal, mounting an LED on an inner end of the first metal, wire-bonding top electrode to an inner end of the second metal, encapsulating at least the LED and the bonding wire with a protection glue, bending an outer end of the first metal upward twice 90 degrees to form a top flat as an extended top electrode of the package, and bending an outer end of the second metal downward twice 90 degrees to form a bottom flat as an extended bottom electrode of the package.

8 Claims, 7 Drawing Sheets

LED PACKAGE WITH TOP AND BOTTOM ELECTRODES

RELATED APPLICATIONS

The present application is based on, and claims priority from, Taiwan Application Serial Number 098124031, filed Jul. 16, 2009, the disclosure of which is hereby incorporated by reference herein in its entirety.

FIELD

This disclosure relates to a light emitting diode (LED) package, and especially relates to an LED package which has a first extended electrode exposed on a top surface and a second extended electrode exposed on a bottom surface. The package is adapted to be inserted into a space between a top metal electrode contact and a bottom metal electrode contact of a display system.

BACKGROUND

FIG. 1 is an LED cassette unit 200 which is disclosed in U.S. Pat. No. 7,445,355. The LED cassette unit 200 has a top metal electrode 21 and a bottom metal electrode 22. An insulation layer 25 is sandwiched in between the top metal electrode 21 and the bottom metal electrode 22. A center void is made in a center of the top metal electrode 21 and the insulation layer 25 to expose a center surface of the bottom metal electrode 22. An LED 20 is mounted on the bottom metal electrode 22 in the center void. A metal wire 24 electrically couples a top electrode of the LED 20 to the top metal electrode 21. A bottom electrode of the LED 20 electrically contacts the bottom metal electrode 22. Protection glue 23 encapsulates the metal wire 24 and the LED 20 for ensuring the quality and reliability of the LED package.

DETAILED DESCRIPTION

An improved manufacturing process to manufacture an LED package with a top electrode and a bottom electrode is disclosed. The process includes preparing a piece of metal sheet, forming a pair of coplanar metals, namely, a first metal and a second metal, mounting an LED chip on an inner end of the first metal, wire-bonding a top electrode of the LED chip to an inner end of the second metal, molding to protect at least the LED chip and the bonding wire, bending an outer end of the first metal upward to form an extended flat top electrode, and bending an outer end of the second metal downward to form an extended bottom flat electrode.

FIGS. 2A, 2B, 3A, and 3B show different views of a first embodiment according to the present disclosure.

Figure 1:
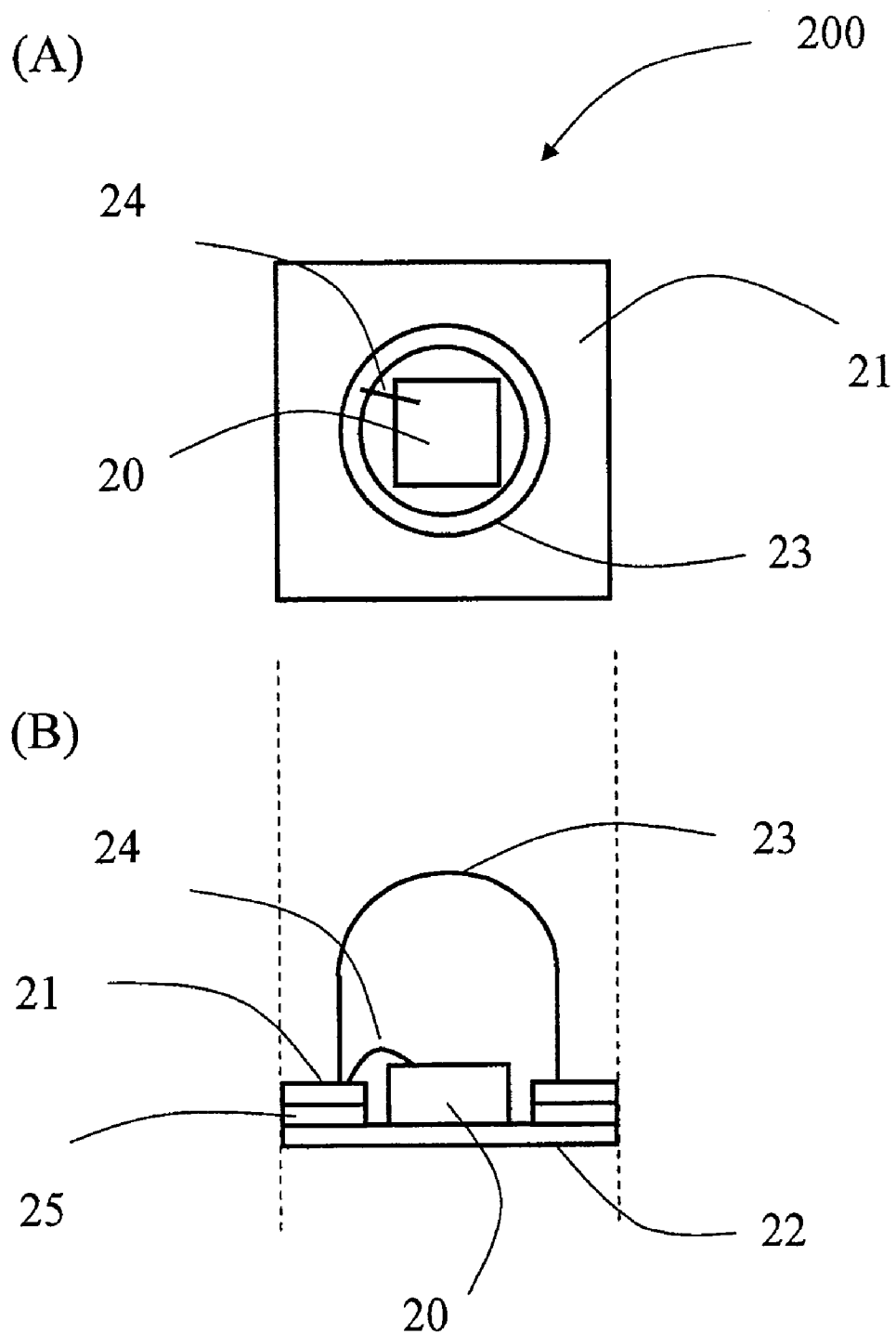
FIG. 1 shows an LED cassette unit.
Figure 2:
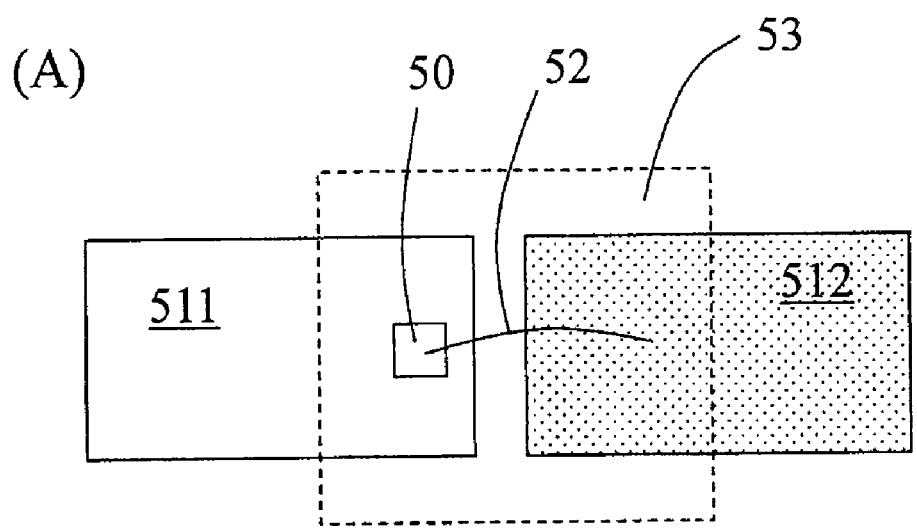
FIGS. 2A, 2B, 3A, and 3B show different views of a first embodiment according to the present disclosure.
Figure 2:
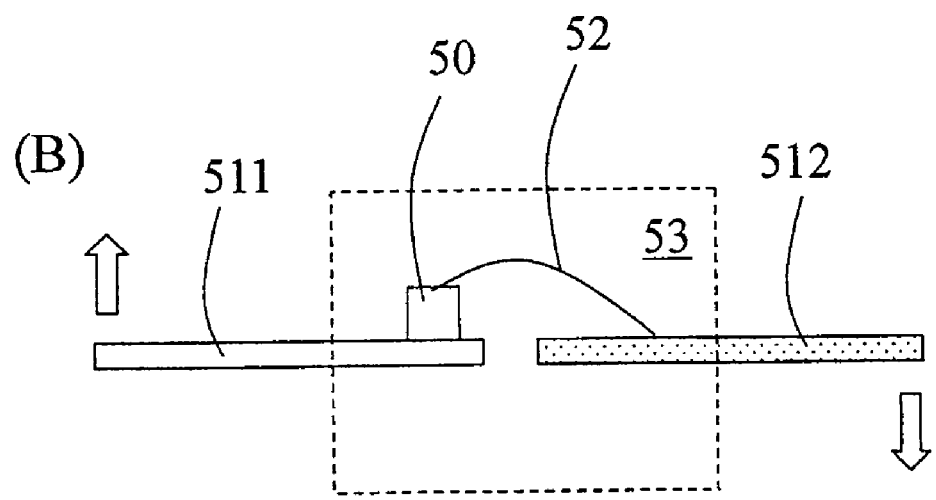

FIG. 2A shows a first embodiment before bending the metals according to the present disclosure. The process includes: (1) preparing a single piece of metal sheet (not shown), (2) forming a first metal 511 and a coplanar second metal 512 by, for example, punching the single piece of metal sheet, (3) mounting an LED 50 on an inner end of the first metal 511 and electrically coupling a bottom electrode of the LED 50 to the first metal 511, (4) electrically coupling a top electrode of the LED 50 to an inner end of the second metal 512 through wire-bonding with a metal wire 52, and (5) protection molding with glue 53 for fixing and protecting at least the LED 50, the wire 52, and the inner ends of the two metals 511, 512.

FIG. 2B shows a side view of FIG. 2A. An outer end of the first metal 511 exposed outside of the glue 53 is going to be bent upward, and an outer end of the second metal 512 is exposed outside of the glue 53 going to be bent downward.

Figure 3:
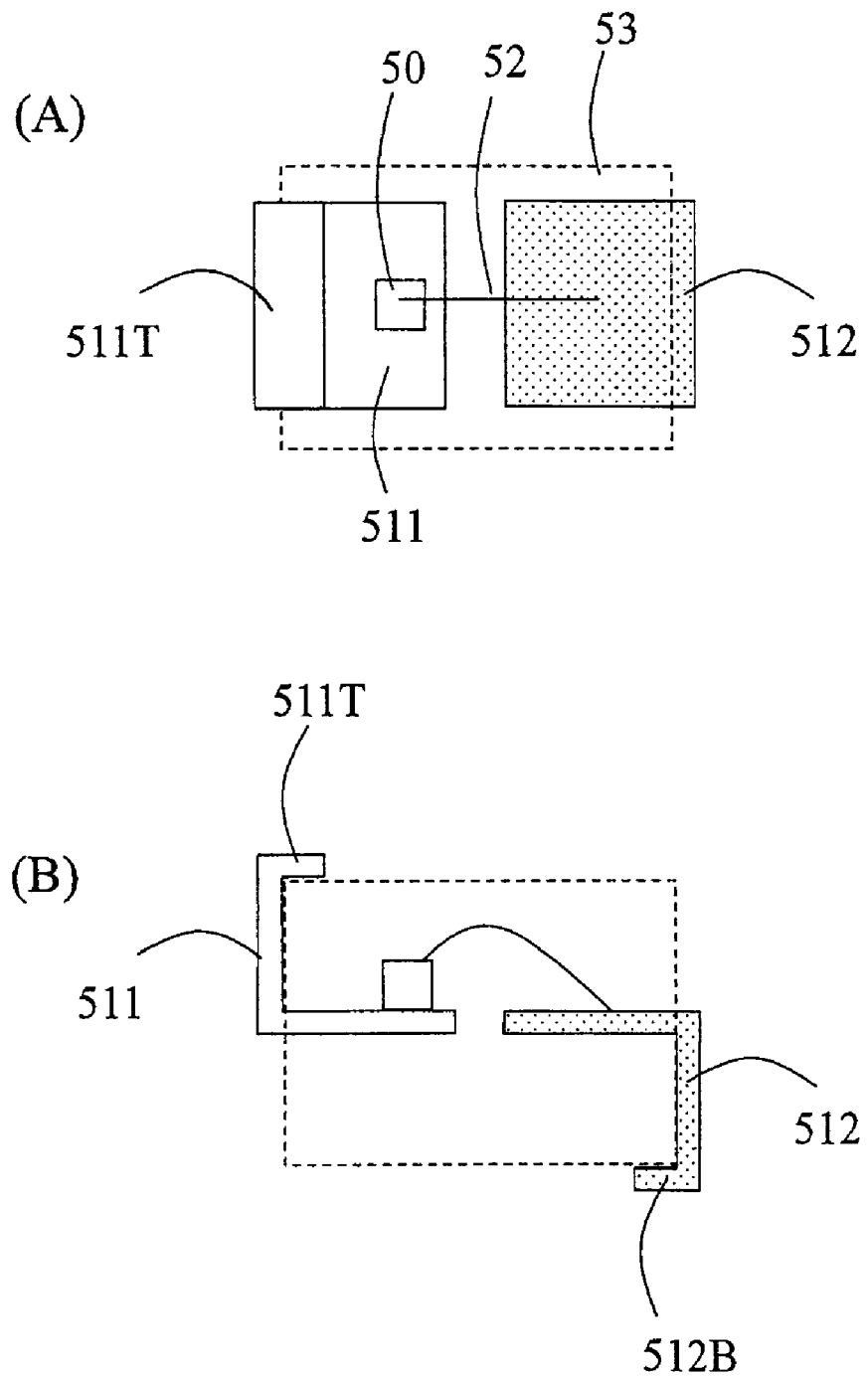

FIG. 3A shows a top view after bending of the metals 511, 512 according to the present disclosure. The outer end of the first metal 511 is bent upward twice 90 degrees to form a top flat 511T as a first extended electrode. The outer end of the second metal 512 is bent downward twice 90 degrees to form a bottom flat 512B as a second extended electrode.

FIG. 3B shows a side view of FIG. 3A. The outer end of the first metal 511 is bent to form a c-shape top flat 511T as a top electrode of the package. The outer end of the second metal 512 is bent to form an inverse c-shape bottom flat 512B as a bottom electrode of the package.

FIGS. 4A, 4B, 5A, 5B, and 6A-6D show different views of a second embodiment according to the present disclosure.

Figure 4:
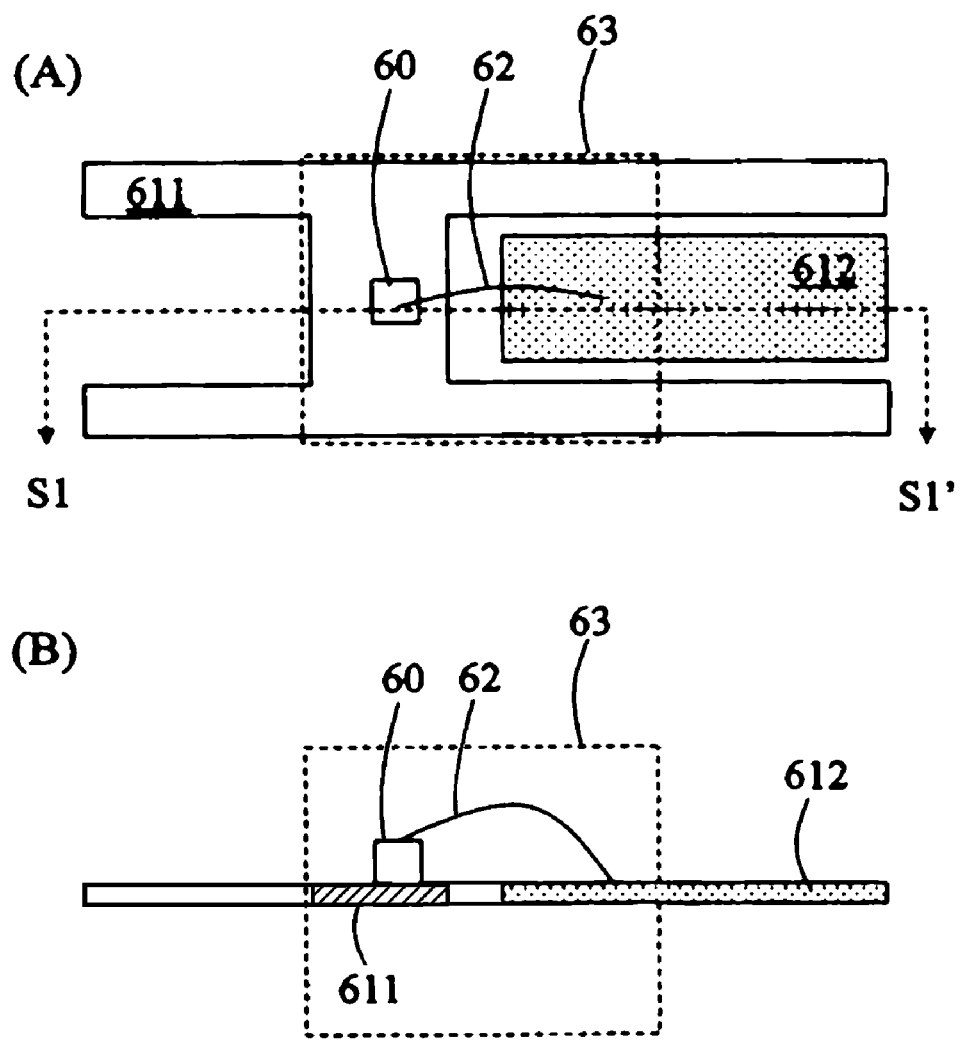
FIGS. 4A, 4B, 5A, 5B, and 6A-6D show different views of a second embodiment according to the present disclosure.

FIG. 4A shows a second embodiment before bending the metals according to the present disclosure. The process includes: (1) preparing a single metal sheet (not shown), (2) forming an I metal 611 (first metal) and a coplanar rectangular metal 612 (second metal); the I metal 611 has a vertical beam, a first pair of horizontal legs extended from a first side of the vertical beam, and a second pair of horizontal legs extended from a second side of the vertical beam; the rectangular metal 612 is located in between one of the two pairs of horizontal legs, (3) mounting an LED 60 on the vertical beam of the I metal 611, electrically coupling a bottom electrode of the LED 60 to the I metal 611 through direct contact, (4) electrically coupling a top electrode of the LED 60 to an inner end of the rectangular metal 612 through wire-bonding with a metal wire 62, and (5) protection molding with glue 63 for fixing and protecting at least the LED 60, the metal wire 62, and the inner end of the rectangular metal 612.

FIG. 4B shows a side view of FIG. 4A. Outer ends of the four horizontal legs of the I metal 611 are exposed outside of the glue 63, with each of the four horizontal legs to be bent upward, and an outer end of the rectangular metal 612 exposed outside of the glue 63 to be bent downward.

Figure 5A:
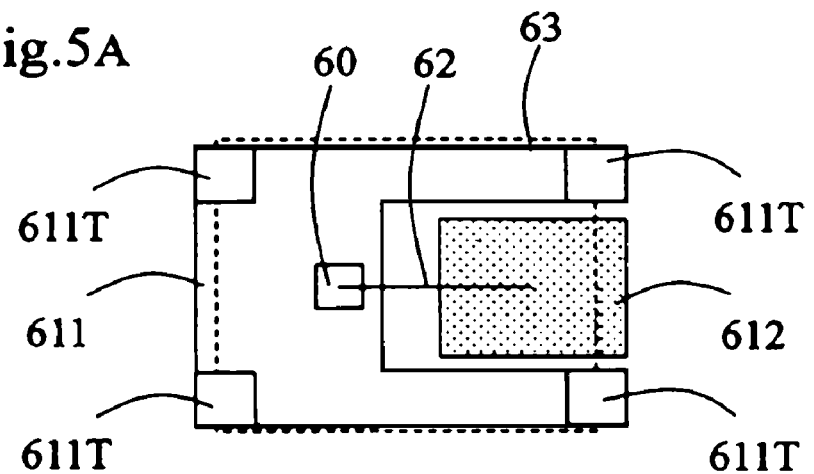

FIG. 5A shows a top view after bending the horizontal legs of the I metal 611 and the rectangular metal 612 according to the present disclosure. Each of the outer ends of the four horizontal legs of the I metal 611 is bent upward twice 90 degrees to form four top flats 611T as extended top electrodes of the LED package. The outer end of the rectangular metal 612 is bent downward twice 90 degrees to form a bottom flat 612B as an extended bottom electrode of the LED package.

Figure 5B:
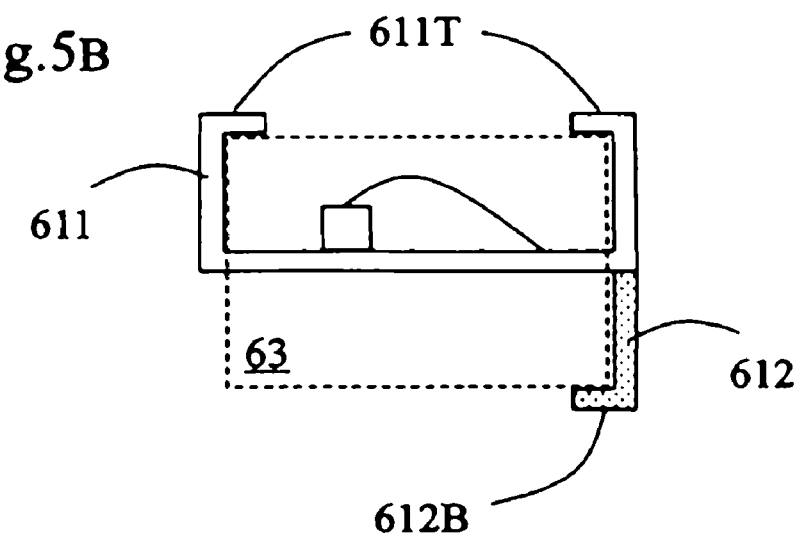

FIG. 5B shows a side view of FIG. 5A. The first pair of horizontal legs from the first side of the I metal 611 are bent to form a pair of c-shape metal with two top flats 611T, a first top electrode and a second top electrode of the package. The second pair of horizontal legs from the second side of the I metal 611 are bent to form a pair of inverse c-shape metal with two top flats 611T as a third top electrode and a fourth top electrode of the package. The rectangular metal 612 is bent to form an inverse c-shape metal with the bottom flat 612B as a bottom electrode of the LED package.

Figure 6A:
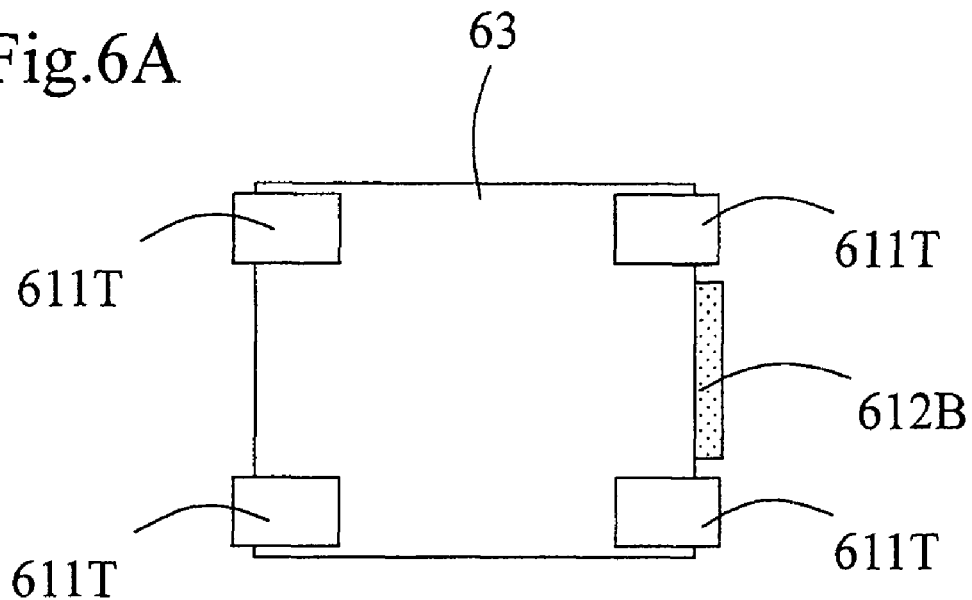

FIG. 6A shows a top view of the LED package shown in FIG. 5A or 5B. Four top flats 611T are shown which function as extended top electrodes of the LED package.

Figure 6B:
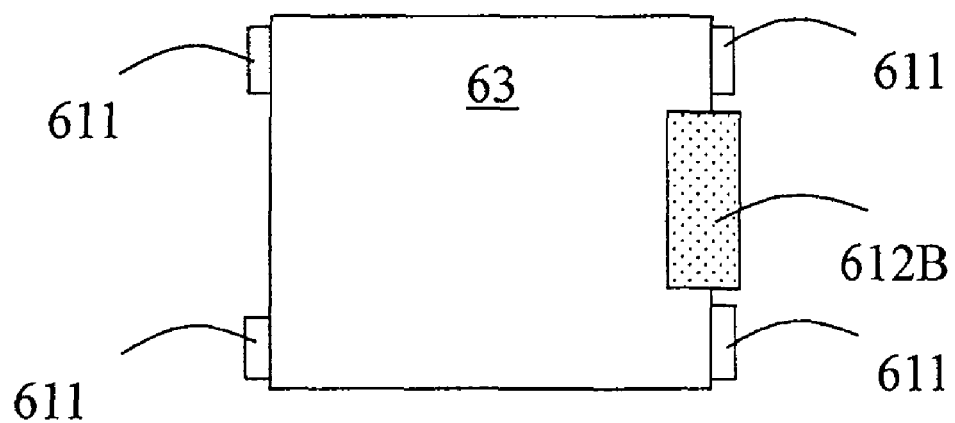

FIG. 6B shows a bottom view of the LED package shown in FIG. 5A or 5B. The bottom flat 612B is shown which functions as a bottom electrode of the LED package.

Figure 6C:
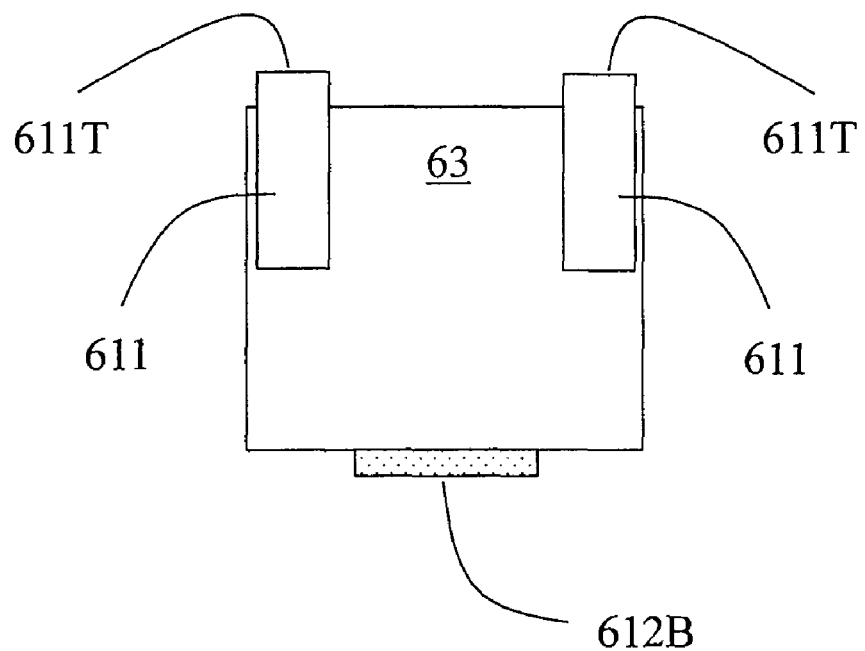

FIG. 6C shows a first side view of the LED package shown in FIG. 5A or 5B. The first pair of horizontal legs from the first side of the I metal 611 and the two top flats 611T are shown on the first side of the LED package.

Figure 6D:
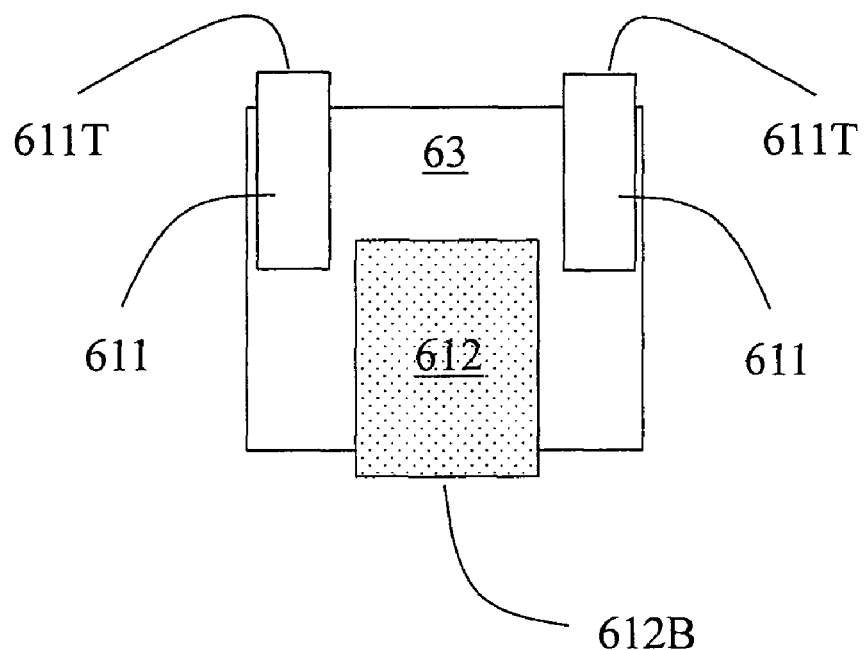

FIG. 6D shows a second side view of the LED package shown in FIG. 5A or 5B. The second pair of horizontal legs from the second side of the I metal 611, the two top flats 611T, and the rectangular metal 612 are shown on the second side of the LED package.

While several embodiments have been described by way of example, it will be apparent to those skilled in the art that various modifications may be made without departing from the spirit of the claimed subject matter. Such modifications are all within the scope of the present disclosure, as defined by the appended claims.

What is claimed is:

1. An LED package, comprising:
    a first metal bent upwards twice 90 degrees to form a top flat and a bottom flat, wherein the top flat of the first metal forms a top electrode of the LED package;
    a second metal bent downwards twice 90 degrees to form a top flat and a bottom flat, wherein the bottom flat of the second metal forms a bottom electrode of the LED package;
    wherein the bottom flat of the first metal and the top flat of the second metal are coplanar;
    an LED electrically coupled to the bottom flat of the first metal and to the top flat of the second metal; and
    a protection molding in which the LED is enclosed.

2. The LED package of claim 1, wherein a top surface of the top flat of the first metal extends outside the protection molding as the top electrode of the LED package, and wherein a bottom surface of the bottom flat of the second metal extends outside the protection molding as the bottom electrode of the LED package.

3. The LED package of claim 1, wherein the LED is electrically coupled by a metal wire to at least one of the bottom flat of the first metal and the top flat of the second metal, and wherein the protection molding further encloses the wire, the bottom flat of the first metal, and the top flat of the second metal.

4. The LED package of claim 1, wherein the bottom flat of the first metal and the top flat of the second metal are coplanar.

5. An LED package, comprising:
    a c-shape metal having a top flat and a bottom flat, wherein the top flat of the c-shape metal forms a top electrode of the LED package;
    an inverse c-shape metal having a top flat and a bottom flat, wherein the bottom flat of the inverse c-shape metal forms a bottom electrode of the LED package;
    wherein the bottom flat of the c-shape metal and the top flat of the inverse c-shape metal are coplanar;
    an LED mounted on and electrically coupled to the bottom flat of the c-shape metal and coupled by a metal wire to the top flat of the inverse c-shape metal; or the LED mounted on the electrically coupled to the top flat of the inverse c-shape metal and coupled by a metal wire to the bottom flat of the c-shape metal; and
    a protection molding enclosing the LED and the metal wire.

6. The LED package of claim 5, wherein a top surface of the top flat of the c-shape metal extends outside the protection molding to form the top electrode of the LED package, and wherein a bottom surface of the bottom flat of the inverse c-shape metal extends outside the protection molding to form the bottom electrode of the LED package.

7. The LED package of claim 5, wherein the protection molding further encloses the bottom flat of the c-shape metal and the top flat of the inverse c-shape metal.

8. The LED package of claim 5, wherein the bottom flat of the c-shape metal and the top flat of the inverse c-shape metal are coplanar.

* * * * *

UNITED STATES PATENT AND TRADEMARK OFFICE
CERTIFICATE OF CORRECTION

PATENT NO. : 8,247,835 B2  Page 1 of 1
APPLICATION NO. : 12/554189
DATED : August 21, 2012
INVENTOR(S) : Wu It is certified that error appears in the above-identified patent and that said Letters Patent is hereby corrected as shown below:

In Column 2, Line 10, delete "53" and insert -- 53 is --, therefor.

Signed and Sealed this
Fifth Day of February, 2013

Teresa Stanek Rea
*Acting Director of the United States Patent and Trademark Office*